United States Patent [19]

Hsu

[11] Patent Number: 5,654,128
[45] Date of Patent: Aug. 5, 1997

[54] SINGLE RESIST LAYER LIFT-OFF PROCESS FOR FORMING PATTERNED LAYERS ON A SUBSTRATE

[75] Inventor: Duanfu Stephen Hsu, Santa Clara, Calif.

[73] Assignee: NGK Insulators, Ltd., Japan

[21] Appl. No.: 601,826

[22] Filed: Feb. 15, 1996

Related U.S. Application Data

[63] Continuation of Ser. No. 325,164, Oct. 21, 1994, abandoned.
[51] Int. Cl.$^6$ ........................................................ G03F 7/26
[52] U.S. Cl. ........................... 430/324; 430/315; 430/329; 430/330; 430/3
[58] Field of Search ...................... 430/311, 313, 430/314, 315, 317, 318, 323, 324, 329, 330, 3

[56] References Cited

U.S. PATENT DOCUMENTS

| | | | |
|---|---|---|---|
| 4,119,483 | 10/1978 | Hübsch et al. | 156/655 |
| 4,212,935 | 7/1980 | Canavello | 430/323 |
| 4,814,258 | 3/1989 | Tam | 430/315 |
| 4,871,651 | 10/1989 | McCune | 430/315 |

OTHER PUBLICATIONS

IBM Technical Disclosure Bulletin, vol. 24, No. 4, Sep 1981, N.Y., pp. 2151–2152, Anonymous "Enhanced Single Layer Lift Off Process, Sep. 1981".
D.J. Elliott "Integrated Circuit Fabrication", McGraw–Hill, N.Y., pp. 291–295.
"Single–Step Optical Lift–Off Process", M. Hatzakis et al., *IBM J. Res. Develop.*, vol. 24, No. 4, Jul. 1980, pp. 452–460.
"The Mechanism of Single–Step Lift off with Chlorobenzene in a Diazo–Type Resist", R.M. Halverson et al., *IBM J. Res. Develop.*, vol. 26, No. 5, Sep. 1982, pp. 590–595.
"Process Control of the Chlorobenzene Single–Step Liftoff Process with a Diazo–Type Resist", George G. Collins et al., *IBM J. Res. Develop.*, vol. 26, No. 5. Sep. 1982, pp. 596–604.
"Lift–Off Techniques for Fine Line Metal Patterning", J.M. Frary et al., *Semiconductor International*, Dec. 1981, pp. 72–88.
"Single–Step, Positive–Tone, Lift–Off Process Using AZ 5214–E Resist", D.R. Dunbobbin et al., SPIE, vol. 922, Optical/Laser Microlithography (1988), pp. 247–254.
"New Trilevel and Bilevel Resist Systems Using Silyl Ethers of Novolak and Low Molecular Weight Resist", Ryuji Kawazu et al., *J. Vac. Sci. Technol.*, B 4(1), Jan./Feb. 1986, pp. 409–413.
"Electron Resists for Microcircuit and Mask Production", M. Hatzakis, *J. Electrochem, Soc.: Electrochemical Technology*, vol. 116, No. 7, Jul. 1969, pp. 1033–1037.
"The Mechanism of Overhang Formation in Diazide/Novolak Photoresist Film by Chlorobenzene Soak Process", Yoshiaki Mimura, *J. Vac Sci. Technol.*, B 4(1), Jan./Feb. 1986, pp. 15–21.
"PMMA Copolymers as High Sensitivity Electron Resists", M. Hatzakis, *J. Vac. Sci. Technol.*, 16(6), Nov./Dec. 1979, pp. 1984–1988.

*Primary Examiner*—Kathleen Duda
*Attorney, Agent, or Firm*—Parkhurst, Wendel & Burr, L.L.P

[57] ABSTRACT

A single resist layer lift-off process for forming patterned layers on a substrate, wherein a post-soak bake is used to control the extent to which chlorobenzene penetrates the resist layer. A post-metallization bake can also be employed to improve lift-off of the resist layer. The process of the present invention provides the resist profile with increased overhang length and the sidewalls of the resist profile with a negative slope. Such increased overhang length and negative slope prevent metallization of the sidewalls of the resist, and thus facilitate more rapid removal of the resist during lift-off.

24 Claims, 19 Drawing Sheets

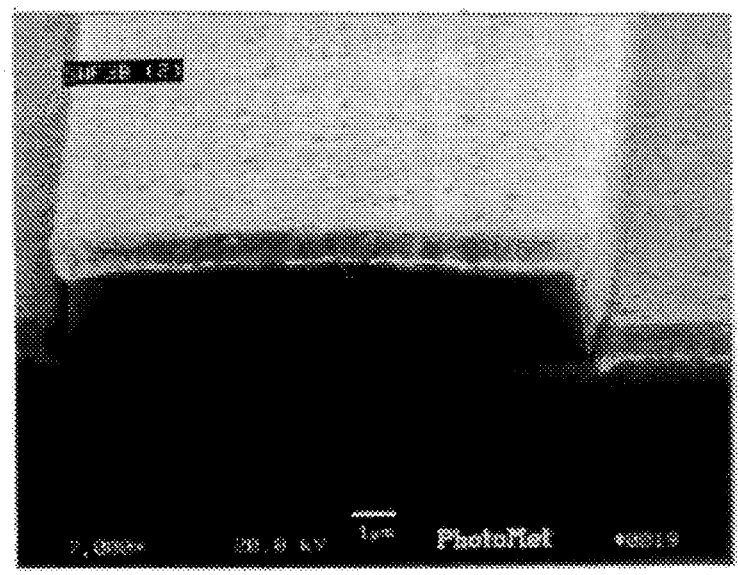
FIG. 2a - PRIOR ART
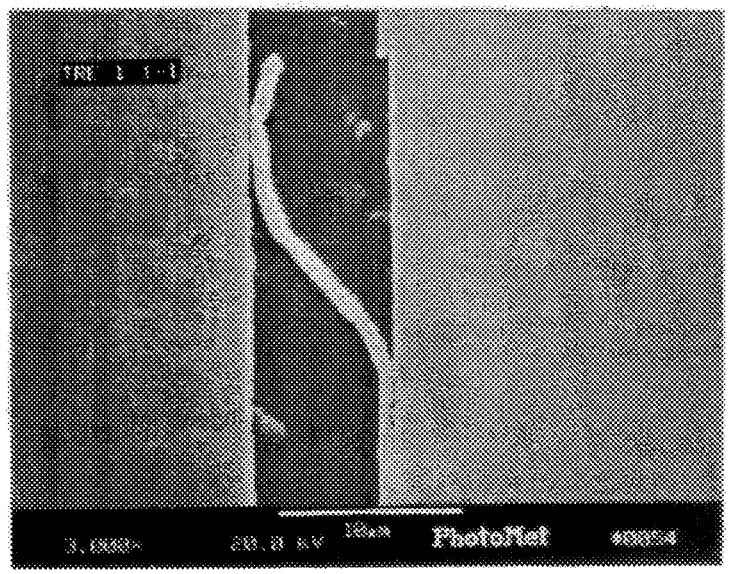
FIG. 4 - PRIOR ART

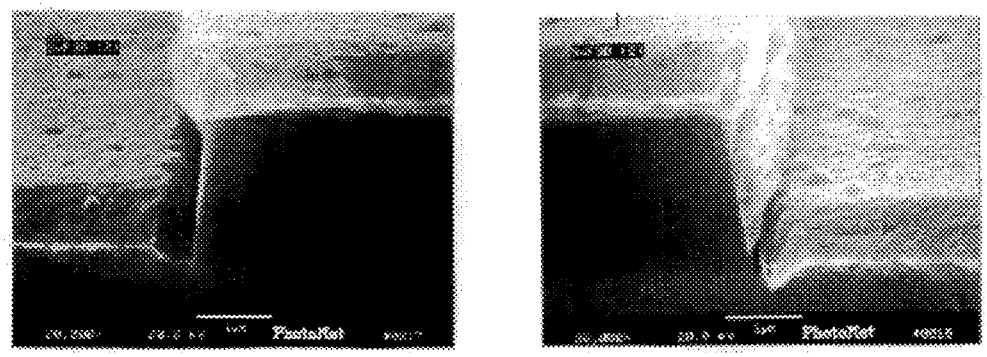
FIG. 2b - PRIOR ART

FIG. 6 - PRIOR ART
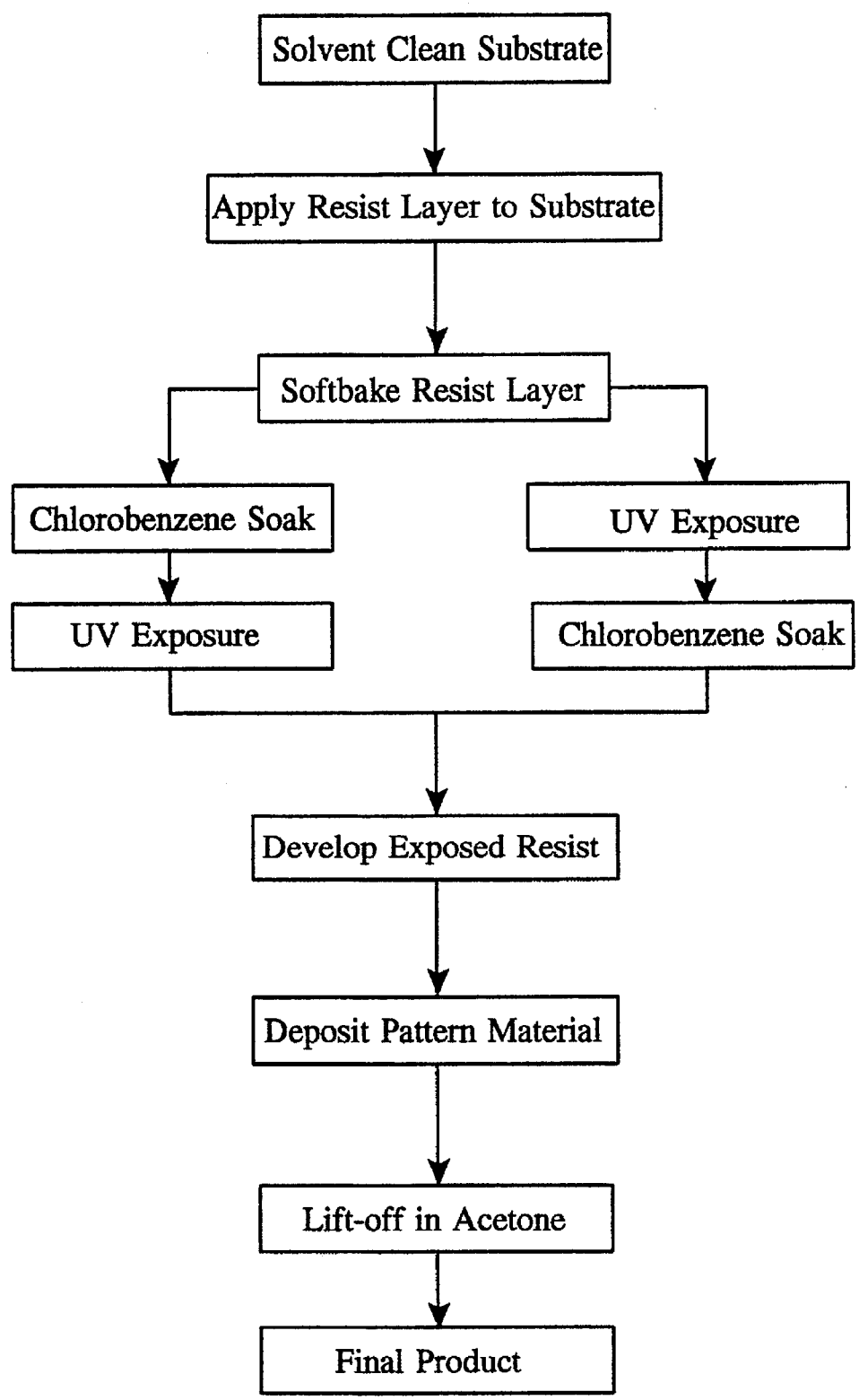

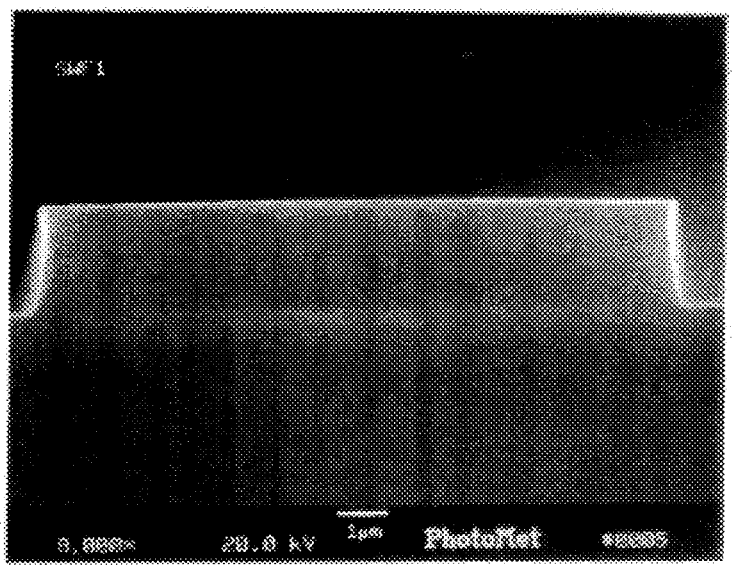
FIG. 14a - PRIOR ART
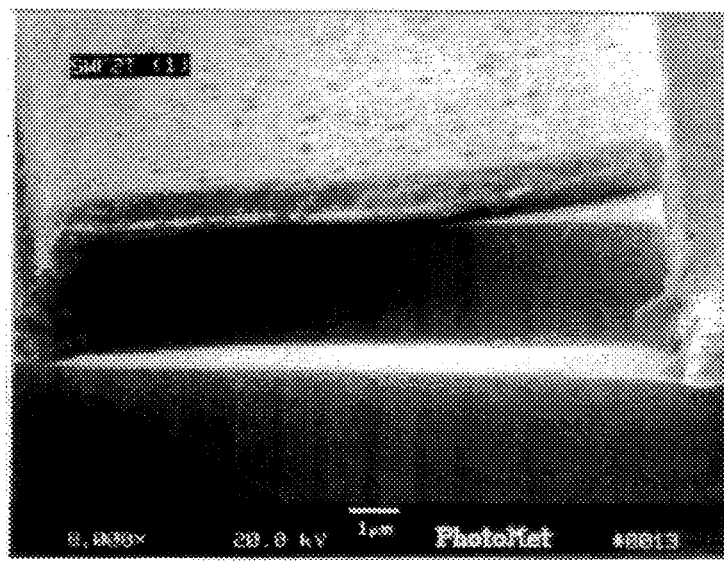
FIG. 15a - PRIOR ART

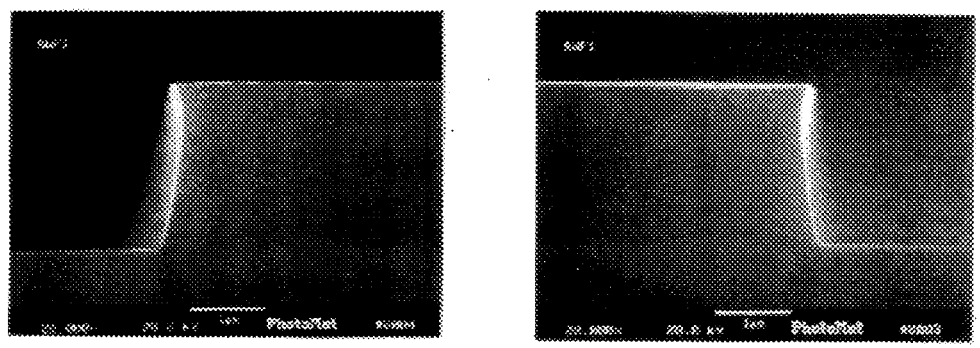
FIG. 14b - PRIOR ART

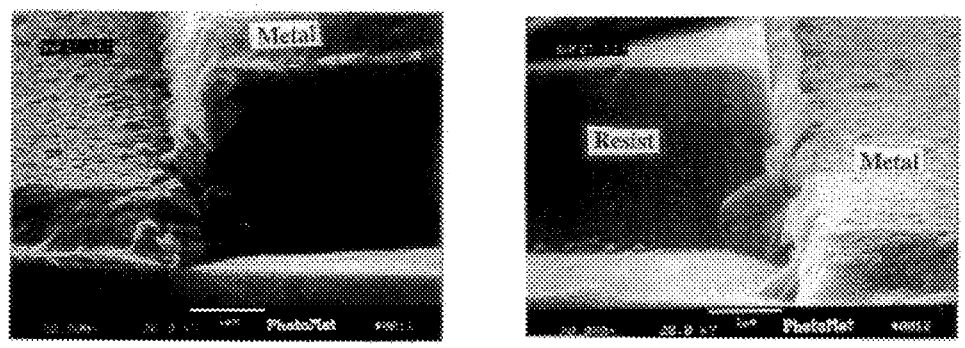
FIG. 15b - PRIOR ART

SINGLE RESIST LAYER LIFT-OFF PROCESS FOR FORMING PATTERNED LAYERS ON A SUBSTRATE

This is a continuation of application Ser. No. 08/325,164 filed Oct. 21, 1994, now abandoned.

BACKGROUND OF THE INVENTION

The present invention relates to a single resist layer lift-off process for forming patterned layers on a substrate. The process provides a patterned resist layer having improved resist profile overhang and negative slope in the sidewalls of the resist profile, which collectively increase production yield and reduce production time and expense.

Lift-off processing is often referred to as an "additive" process in contrast to the more typical use of a photoresist mask where the areas of desired metallization are protected and the undesired areas are left exposed and etched away using appropriate chemicals. In a lift-off process, the substrate is covered by photoresist everywhere except in areas where the metallization is desired. The metal is then added, covering the entire substrate with the metal sitting on top of the photoresist and in contact with the substrate in the open areas. The photoresist is subsequently removed lifting the unwanted metal away from the substrate, leaving behind the desired metal pattern.

The impetus for the lift-off process was the need to pattern metal lines on substrates where the use of chemical or plasma etching is either undesirable or incompatible with the process or materials involved. An example of this is in the processing of GaAs substrates. Typical metallization schemes require the use of a metal composites to form contacts and transmission lines. Typical metals used are aluminum, gold, nickel, chromium, platinum, tantalum, titanium and others, where the required contacts may use two or three layers of these metals in some combination. Etching these metals would require very harsh chemicals that would severely attack the GaAs substrate and degrade the performance of the device.

The other primary need for lift-off processing is when tight line width control is required. Typically, a wet chemical etch is isotropic in nature. Due to processing related deviations, metal films typically have thickness variations across the wafer. Film thickness variation requires the wafer be "over etched" in order to assure that complete etching has occurred. This translates into line widths being reduced when the isotropic etch works under the resist mask. The most severe case occurs where the film thickness is at a minimum. Because the lift-off process depends only on the control of the photoresist, line width is maintained independent of metal thickness or variations in the etch process.

The lift-off process was first introduced as a "brute force" processing technique. The idea was to deposit a thin metal coating 3 (~0.2 μm) over a thick (~2 μm) photoresist pattern 2, and then force the metal to make a clean break as shown in FIG. 1. Unfortunately this idealized process is not practical. First, the process requires the metal to be delivered normal to the surface of the substrate 1. The best approximation to this situation would occur in an evaporator. The metal "melt" is kept in a water cooled crucible inside an evacuated chamber (typically in the $10^{-6}$ to $10^{-8}$ Torr range) where an electron beam is directed via a magnetic field to impinge on the metal surface, heating the metal in a controlled manner. Due to the elevated temperature of the metal melt, a vapor pressure is created allowing the metal atoms to diffuse throughout the chamber, as if from a point source.

If the substrates are suspended at a sufficient distance, and aligned tangent to the parabolic curve of a dome, the metal atoms tend to arrive normal to the surface. In reality, certain constraints tend to limit the realization of this phenomena. Wafer surfaces tend to be quite large, ranging from 3 to 8 inches in diameter, so only a small portion can be tangent to the required curve. Practical considerations also tend to limit the source to wafer distance to under a meter with machining tolerances and quality control in the assembly of commercially available equipment, all making an ideal evaporation impossible to achieve on a production scale.

In reality what happens is the metal is delivered to the substrate at an angle (FIG. 3), and thus the metal will build up on one of the walls of the photoresist as shown in the SEM photographs of FIG. 2a and 2b (FIG. 2b being magnified photographs of each end of FIG. 2a). When the photoresist is subsequently removed, this buildup 3a can remain, a condition known as "winging" or "wing tip" (FIG. 3). Winging metal tends to curl, but remain connected to the deposited metal layer, to short adjacent lines of the metallized pattern, reducing yield (FIG. 4). Still other metallization schemes tend to be worse. Sputtering, which is more conformed than evaporation and chemical vapor deposition of metallic films, will completely cover the photoresist and impede its removal. If the photoresist overhang profile is poor the deposited metal will adhere together with the photoresist sidewall making it difficult to perform lift-off and resulting in rough metal line quality.

The second major obstacle to the brute force approach is the resist profile itself. Because photolithography is an optical process, it is subject to optical constraints. The light (board band or monochromatic) will be absorbed as it passes through the resist layer causing the top of the film to receive a higher dose of energy than the bottom, thus making the top layer of the resist more soluble in the developer. This produces resist profiles that instead of being at right angles to the substrate, form more rounded profiles, larger at the bottom and smaller at the top, defined as a positive slope as shown in FIG. 5a.

In addition to absorption, diffraction also plays a significant role in creating positive slope in the sidewalls of the resist profile allowing the light to spread out and expose a larger area at the surface of the resist. Diffraction effects become greatest when the mask is not in physical contact with the resist, a typical requirement in order to avoid damaging the mask and the wafer. As the gap between the mask and resist increases, the profile becomes quite rounded (FIG. 5b) and resolution is reduced.

In order to bypass these limitations and develop a controllable, repeatable lift-off process, a variety of processes have been developed in order to modify the positive resist profile or to develop complex double- or triple-layered structures whose primary goal is to create an overhang or undercut profile. IBM, in the summer of 1980, introduced the first single resist layer lift-off process that employed resist profile modification. See M. Hatzakis et al., "Single-Step Optical Lift-Off Process", *IBM J. Res. Develop.*, Vol. 24, No. 4, July 1980; R. Halverson et al., "The Mechanism of Single-Step Lift-off with Chlorobenzene in a Diazo-Type Resist," *IBM J. Res. Develop.*, Vol. 26, No. 5, September 1982; and G. Collins et al., "Process Control of the Chlorobenzene Single-Step Liftoff Process with a Diazo-Type Resist", *IBM J. Res. Develop.*, Vol. 26, No. 5, September 1982.

In the IBM process, the positive photoresist is exposed in the usual manner and then soaked in an aromatic solvent, typically chlorobenzene. It is known that the penetration of the solvent into the resist, which defines the depth of the overhang profile, is controlled by the soaking time, solvent content after soft bake, developer concentrations, temperature and impurities in the chlorobenzene. See JP 60-32047 and Chem. Abst. 103-62591. During development of the resist, the previously exposed areas of the resist, where penetrated by chlorobenzene, tend to dissolve slower than the unpenetrated areas. Thus the unpenetrated resist is over-developed, resulting in an undercut resist profile, shown theoretically in FIG. 5c.

The IBM process is shown in flow diagram form in FIG. 6. Although this process has been widely adopted in industry, in production it is very difficult to control. Tight process controls must be observed during soft bake, soak, development and exposure. A small variation in any one of the many variables present in each of these steps will result in reduced production yield, increased production time and increased production expense. Additionally, when the resist is exposed before the chlorobenzene soak, different regions of exposed and unexposed resist have different solubilities to the chlorobenzene. Consequently, it is difficult to diffuse the chlorobenzene uniformly over the surface of the resist.

Other perhaps more significant problems with the IBM process is that the length of the resist profile overhang is insufficient and the sidewalls of the resist profile have positive slope (i.e., they curve into the resist) as shown in FIG. 5c. These problems result in metallization of at least part of the sidewalls of the resist (FIGS. 2a-2b). Such sidewall metallization also leaves wings (3a, FIG. 3) of metal which short adjacent metal lines of the deposited pattern. Such sidewall metallization (FIGS. 2a-2b) also (i) inhibits contact between the acetone and the resist during lift-off and (ii) anchors the resist to the substrate. Accordingly, it can take up to 8 hours for lift-off to be completed.

SUMMARY OF THE INVENTION

It is an object of the present invention to provide a process which overcomes the problems associated with the prior art (IBM) process.

It is another object of the present invention to provide a process that forms a resist profile having improved overhang length and negative slope in the sidewalls of the resist profile (i.e., the sidewalls of the resist profile extend outwardly from the base of the resist to the opening in the resist).

The process of the present invention comprises the steps of depositing a single resist layer on an upper surface of a substrate to form a resist/substrate preform; subjecting the resist/substrate preform to a first heat treatment to adhere the resist layer to the substrate; immersing the resist/substrate preform in a bath of aromatic solvent; subjecting the resist/substrate preform to a second heat treatment; exposing portions of the resist layer in the shape of a pattern; developing the resist layer to remove exposed portions thereof and form a patterned resist layer wherein openings are provided through the resist layer to the upper surface of the substrate; applying a layer of deposition material on the patterned resist layer and through the openings therein to form a desired pattern of material on the upper surface of the substrate; and immersing the substrate, with the patterned resist layer and deposition material formed thereon, in a solvent bath to lift-off the patterned resist layer, with the deposition material formed thereon, while leaving the pattern of material on the upper surface of the substrate.

The present invention will be explained in greater detail below with reference to the attached drawings.

BRIEF DESCRIPTION OF THE DRAWINGS

FIGS. 2a and 2b are SEM photographs showing a substrate with a resist layer and metallization layer formed thereon;

FIG. 4 is an SEM photograph showing shorting of two lines of a metallized pattern by a wing extending from one line to the other;

FIG. 6 shows a flow diagram of a prior art lift-off process;

FIGS. 14a and 14b show the resist profile formed by the prior art process of FIG. 6;

FIGS. 15a and 15b show the resist profile and deposited metal layer formed by the prior art process in FIG. 6;

DETAILED DESCRIPTION OF THE INVENTION

Figure 1:
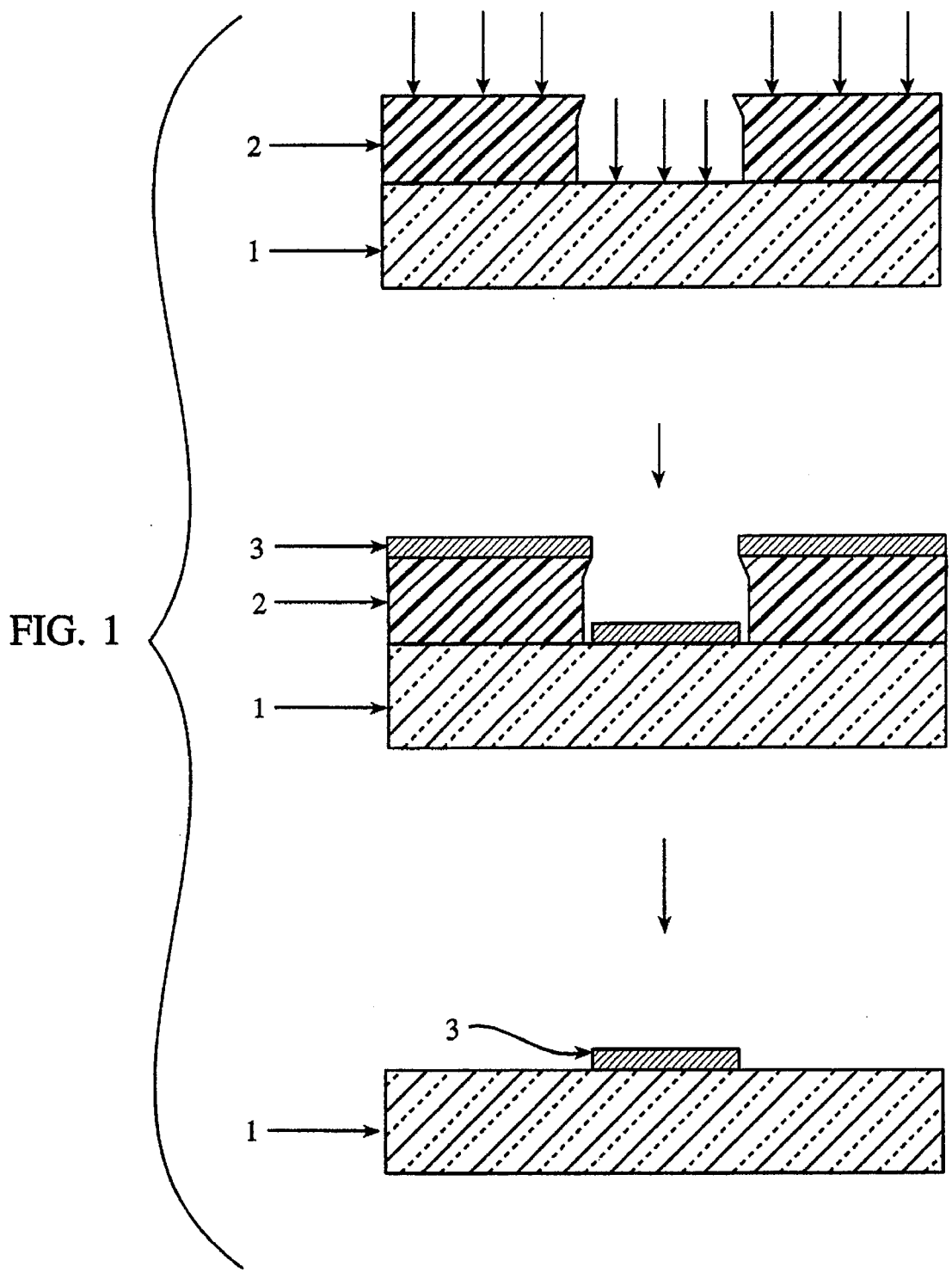
FIG. 1 shows an idealized lift-off process.
Figure 3:
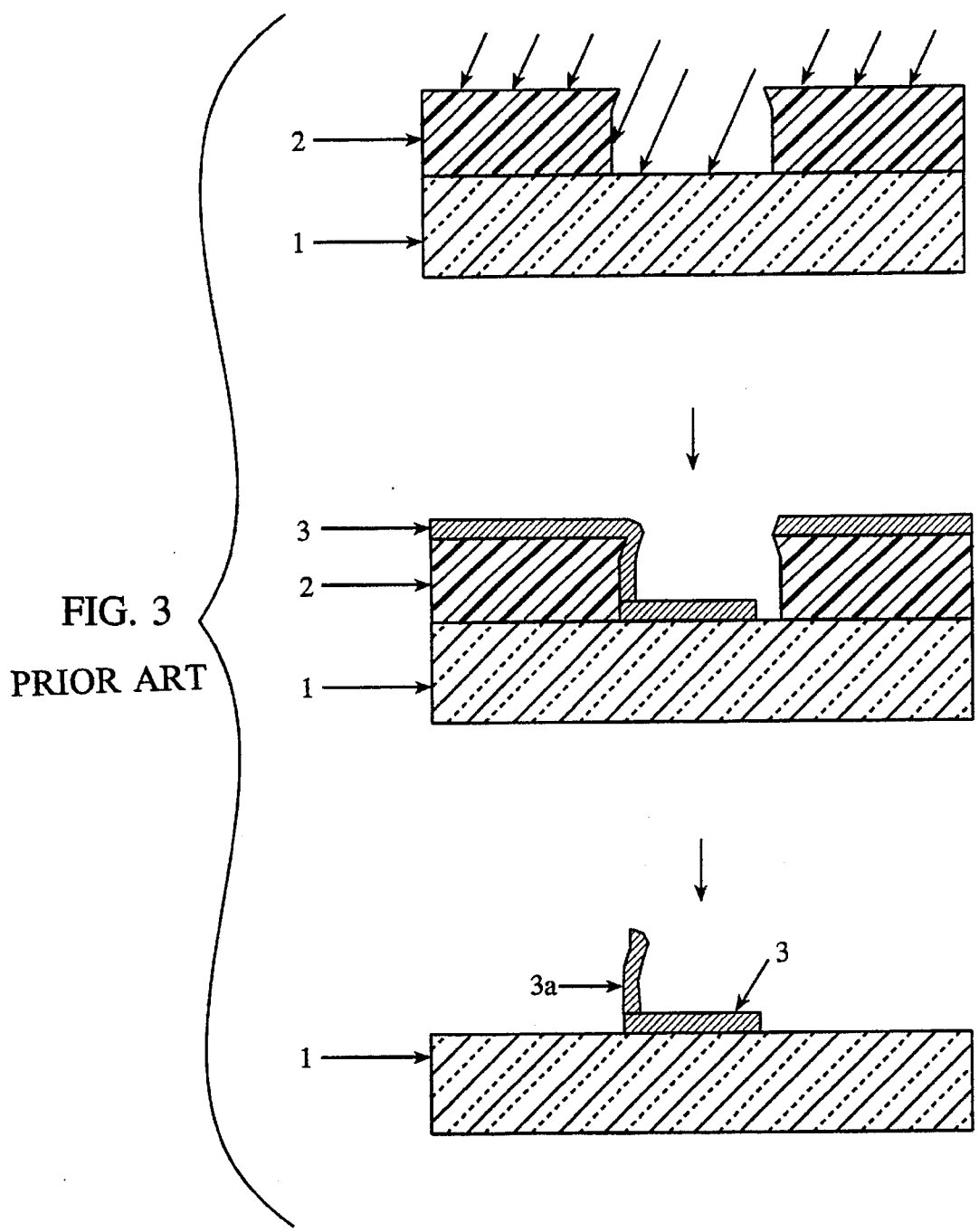
FIG. 3 shows a realistic lift-off process.
Figure 5A:
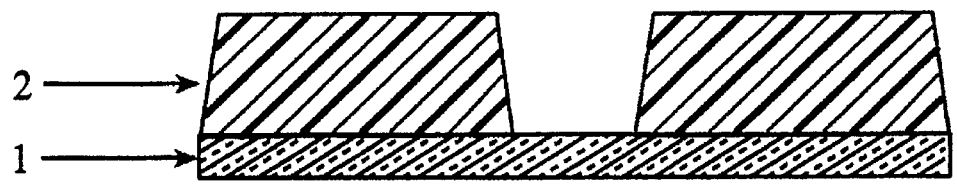
FIGS. 5a-5c show prior art resist profiles.
Figure 5B:
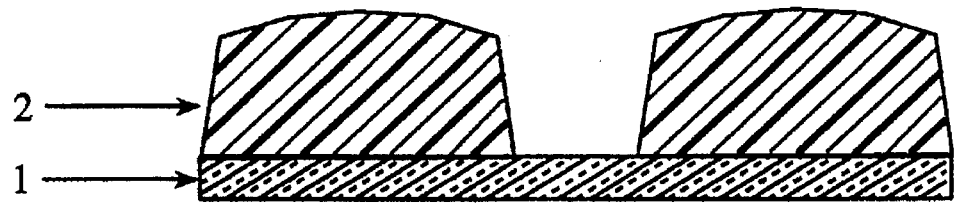
Figure 5C:
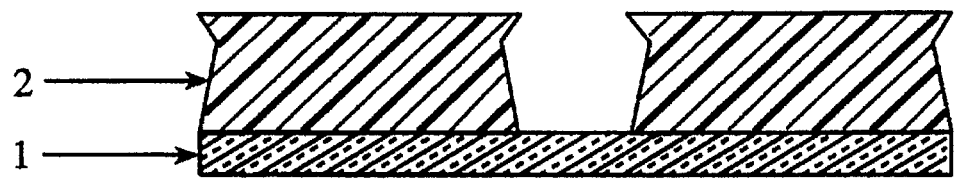
Figure 7:
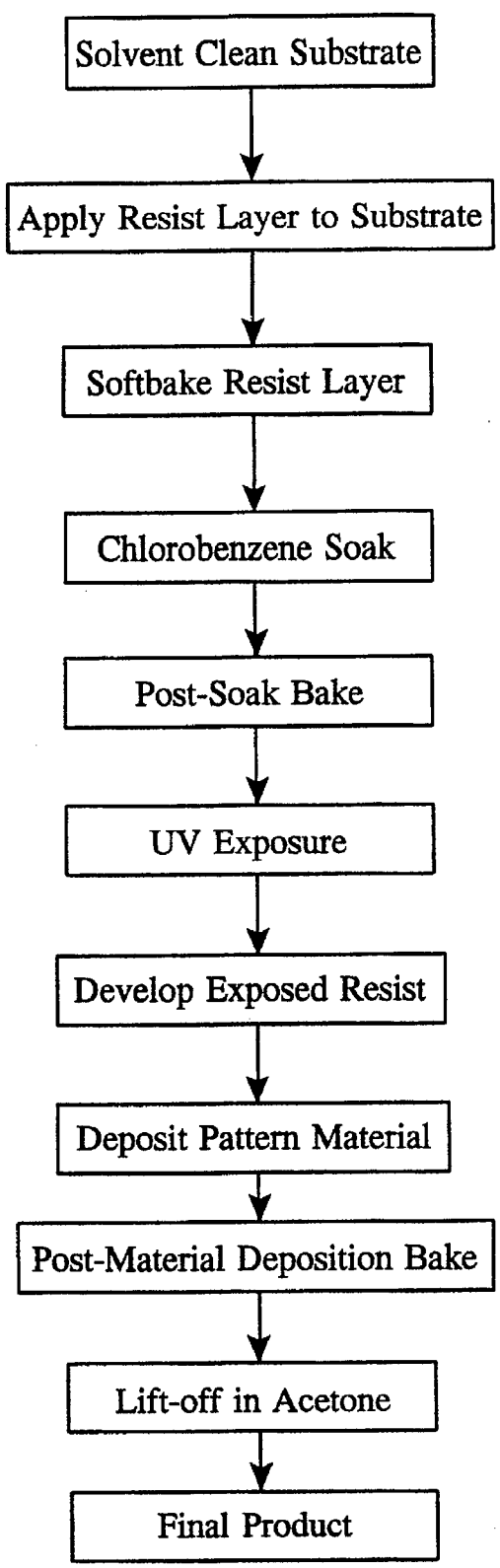
FIG. 7 shows a flow diagram of the lift off process of the present invention.

FIG. 7 is a flow diagram showing the general process steps of the present invention. The process begins with a standard solvent cleaning of the substrate 1. A specific application of the process of the present invention is in the formation of metallized layers on integrated optic devices. In such a case, the substrate can comprise a transparent material such as GaAs or $LiNbO_3$.

A resist layer 2 is then formed on an upper surface of the substrate 1 and subjected to a soft bake to adhere the resist to the substrate and control the thickness of the resist layer 2. The soft bake can range in temperature from 80°–100° C. for about 10–30 minutes, but is preferably performed at about 90° C. for about 20 minutes.

The entire substrate and resist layer (resist/substrate preform) is then soaked in an aromatic solvent, preferably chlorobenzene, for about 5–25 minutes, preferably 10–20 minutes, more preferably about 15 minutes. Since the resist layer contains novolak resins formed by a condensation reaction, the molecular weight dispersivity of the resins is very broad, ranging from 30 to 2000. When soaking the resist coated substrate in the aromatic solvent, the low molecular weight resins and photoactive components are preferentially removed. The absorption of the aromatic solvent at the top surface of the resist also retards dissolution of that resist in the developer solution, and thus contributes to providing increased overhang in the resist profile. That portion of the resist layer which is not penetrated by the aromatic solvent retains its original solubility.

Figure 8:
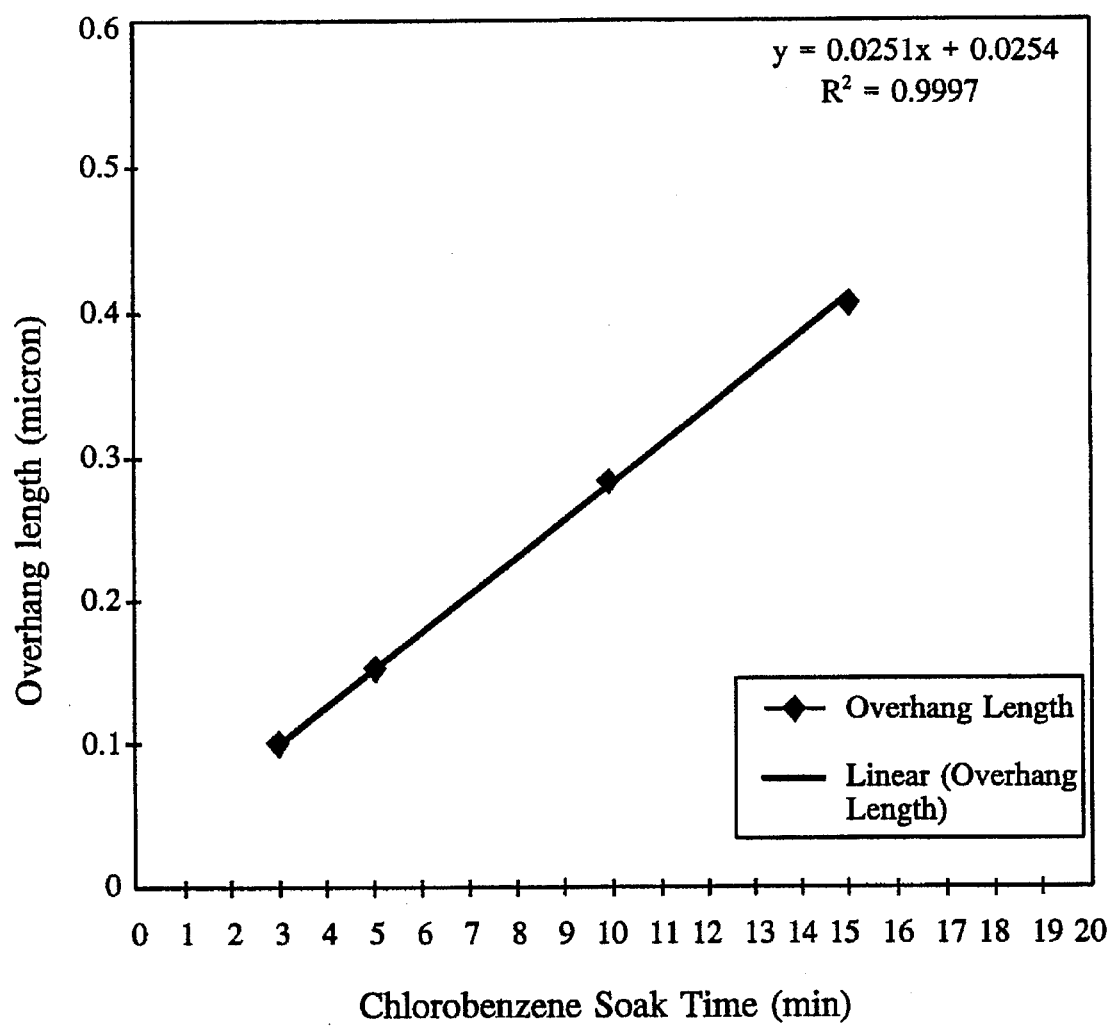
FIG. 8 shows a graph of resist profile overhang length vs. chlorobenzene soak time.
Figure 9:
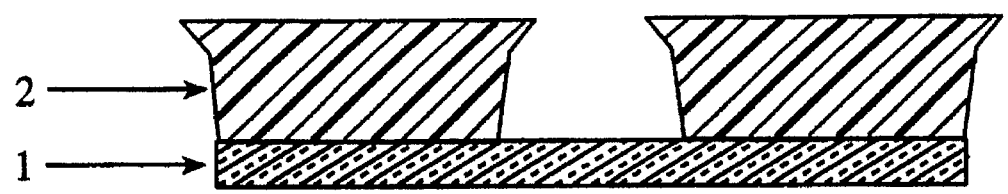
FIG. 9 shows the resist profile resulting from the lift-off process of the present invention.

During the aromatic solvent soak it is difficult to control the depth to which the solvent diffuses into the resist layer. FIG. 8 shows the change in overhang length dependent upon chlorobenzene soak time. In accordance with the present invention, a post-soak bake is employed after the aromatic solvent soak to control the dispersion of aromatic solvent into the resist layer. More specifically, after the entire unexposed resist/substrate preform is soaked in the aromatic solvent, the post-soak baking step is performed to remove any residual solvent in the resist. This baking step thus prevents any further undesired in-diffusion of aromatic solvent into the resist layer. The aromatic solvent thus diffuses into the top layer of the resist forming a consistent induction layer, which in turn provides a more pronounced resist profile overhang. The post-soak bake also forms a negative profile in the sidewalls of the resist profile (FIG. 9).

The post-soak baking of the present invention is performed at a temperature ranging from 80°–100° C. for about 5–15 minutes. More preferably, the post-soak bake is performed at about 90° for about 10 minutes.

The resist layer is then exposed through a mask to define therein the outline of the desired pattern. The exposure step uses standard UV radiation technology and is carried out for about 5–15 seconds, more preferably about 7.5 seconds, when using a LiNbO$_3$ substrate at 13.6 mW lamp intensity.

The resist is then developed by immersion in a standard developing chemical (e.g., Shiply Miroposit 303A) for about 15 seconds, to form a patterned resist having a latent image of the desired pattern to be formed on the substrate.

The next step in the process is to deposit the material for forming the pattern on the substrate. Generally, an aspect ratio of resist layer thickness to deposition material thickness of approximately 2:1 is preferred. Although metal is used in the explanation herein, it is understood that other materials could also be used to form the pattern (e.g., resistive materials, glass materials, and the like). The metal 3 is deposited over the entire upper surface of the resist and on those portions of the upper surface of the substrate which are exposed through the resist. Although any type of metal can be deposited, the most common metals used include aluminum, gold, chromium, nickel, platinum, tantalum, titanium, mixtures thereof and alloys thereof.

If several consecutive layers of relatively thick metal (e.g., >1000 Å) are to be deposited, the inventor has discovered that the substrate, with the resist layer and first metallization layer formed thereon, should be subjected to a post-metallization bake. Such a post-metallization bake makes the resist layer firmer, and thus easier to lift-off, and also assists in providing the sidewalls of the resist profile with improved negative slope as shown in FIG. 9.

The post-metallization bake is performed in a temperature ranging from about 100° C. to about 140° C. for about 15–35 minutes. More preferably the post-metallization bake is performed at 110°–130° C. for 20–30 minutes, and most preferably at about 120° C. for about 25 minutes.

After the post-metallization bake, the entire substrate, with the resist layer and metallization layer formed thereon, is immersed in an acetone bath and subjected to ultrasonic agitation to lift-off the resist layer and that portion of the metallization layer formed thereon, thus leaving the substrate 1 with the desired metallization pattern 3 formed thereon.

Since the process of the present invention improves the overhang length of the resist profile, the resist sidewall is not metallized due to non-normal (i.e., non-perpendicular) application of deposition metal onto the substrate. The fact that the present process provides the sidewalls of the resist profile with a negative slope also prevents the deposition of metal (especially when depositing consecutive layers of relatively thick metal) onto the sidewalls of the resist during the metallization step. As a result, there is no barrier to the acetone contacting the resist during the lift-off step, nor is there any anchoring effect between the metal formed on the upper surface of the substrate and the metal formed on the upper surface of the resist. Accordingly, the lift-off step can be completed in less than 15 minutes, whereas the same step could take 8 hours in the prior art process.

EXAMPLE

A transparent substrate of LiNbO$_3$ was subjected to a conventional solvent cleaning, and then an AZ1350J resist layer was formed on an upper surface of the substrate using a coater at a spin speed of 3000 rpm. The resist was then soft baked at 90° C. for 20 minutes and immersed in a chlorobenzene bath for a soak time of 15 minutes. The resist/substrate preform was then post-soak baked at 90° C. for 10 minutes.

Figure 10A:
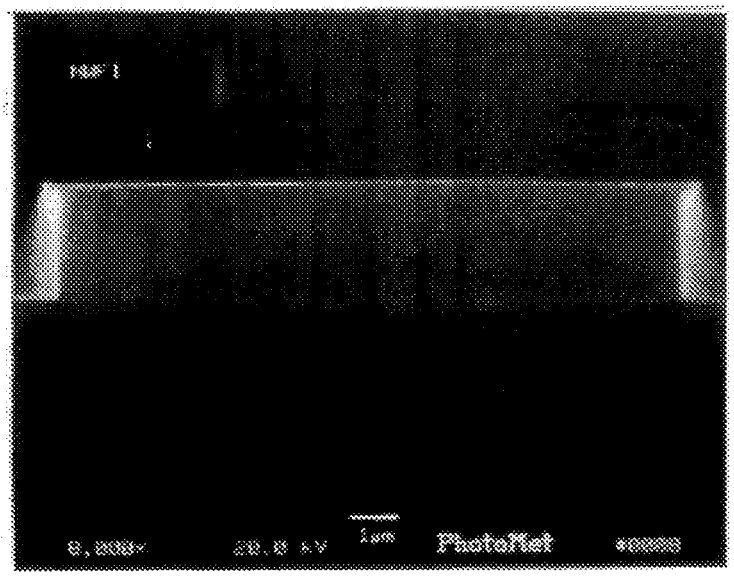
FIGS. 10a and 10b are SEM photographs showing the resist profile formed by the process of the present invention.
Figure 10B:
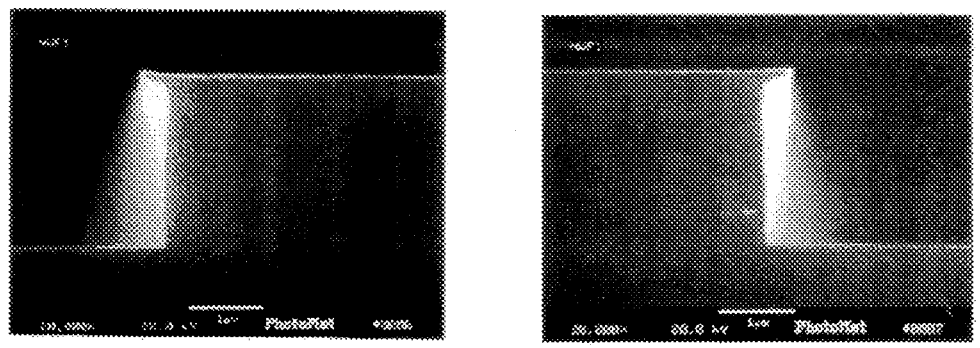

The resist was then exposed through a mask using ultraviolet radiation and an exposure time of 7.5 seconds at 13.6 mW lamp intensity. The resist was then developed using a Shiply Miroposit 303A solution for a period of about 15 seconds. FIG. 10a shows the resist profile of the patterned resist layer and FIG. 10b shows magnified end portions of the resist profile shown in FIG. 10a. The resist profile has an overhang length of about 0.4 µm.

The wafer was then loaded in a Temescal VES-2550 evaporator to deposit, on the substrate through the openings in the resist layer, a first metallization layer of chromium to a thickness of 200 Å and, on the first layer, a second metallization layer of aluminum to a thickness of 9900 Å. After the metallization step the wafer was then post-metallization baked at 120° C. for 25 minutes. This baking step makes the resist layer firmer and also assists in providing the sidewalls of the resist profile with improved negative slope.

Figure 11A:
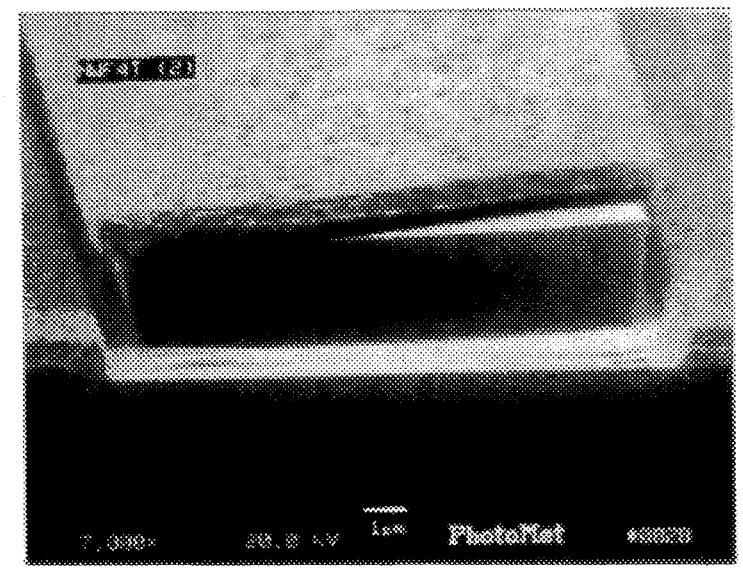
FIGS. 11a and 11b show the resist profile and deposited metal layer formed by the process of the present invention.
Figure 11B:
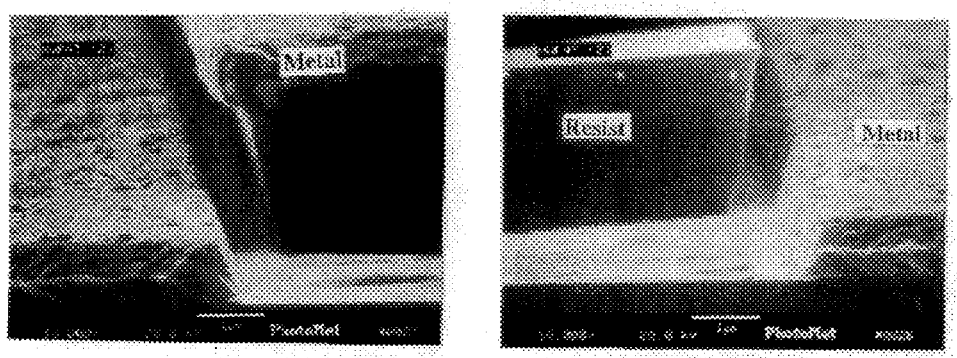

FIGS. 11a and 11b are SEM photographs showing the resist profile and deposited metal layer formed in accordance with this example. FIG. 11b shows the opposite sides of the structure of FIG. 11a at an increased magnification. FIGS. 11a and 11b clearly show that the sidewall of the resist profile has a negative slope and the overhang of the resist profile is pronounced. Consequently, FIGS. 11a and 11b also show that metallization of the sidewall of the resist does not occur, and thus the lift-off step in accordance with the present invention can be performed in about 15 minutes, because the acetone can freely access the resist (FIG. 11b) and no metal exists between the metallization layer on the surface of the substrate and the metallization layer on the upper surface of the resist, which would otherwise result in anchoring the resist to the substrate.

Figure 12A:
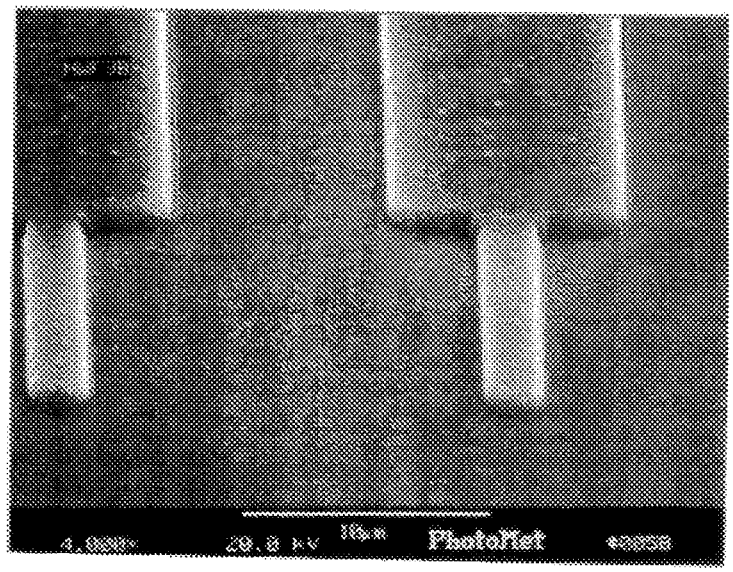
FIGS. 12a and 12b show the line quality of the metallized pattern formed by the process of the present invention.
Figure 12B:
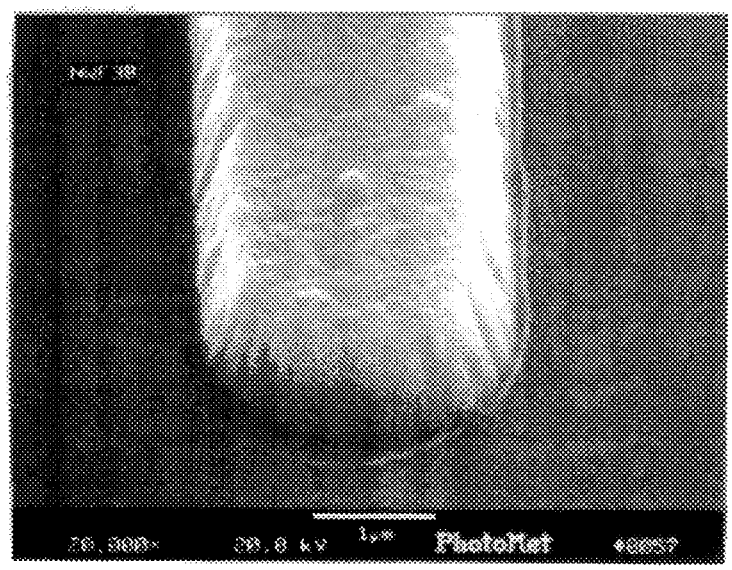

The wafer was then immersed in acetone for 10 minutes and subjected to ultrasonic agitation. The acetone was changed and the step was continued for an additional 5 minutes to achieve complete lift-off of the resist layer and metallization layer formed thereon. FIGS. 12a and 12b show the line quality of the metallized pattern formed in accordance with the present invention. FIG. 12b is a magnified portion of FIG. 12a.

Figure 13:
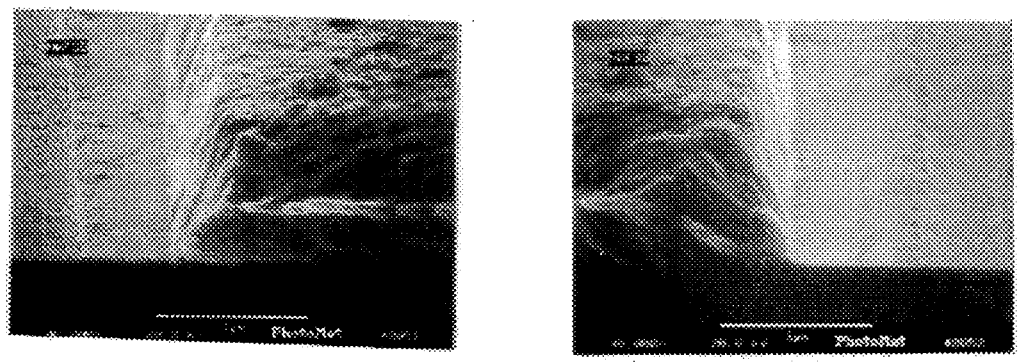
FIG. 13 also shows the line quality of the metallized pattern formed by the process of the present invention.

FIG. 13 also shows the superior line quality of the metallization pattern formed according to the present invention.

COMPARATIVE EXAMPLE

The right-hand branch of the prior art process shown in FIG. 6 was performed under the following conditions:

AZ1350J resist coated at 4000 rpm soft bake at 90° C. for 10 minutes exposed for 5.8 seconds at 13.6 mW lamp intensity chlorobenzene soak for 10 minutes develop in Shiply Miroposit 303A for 10 seconds deposit 200 Å chromium metallization layer followed by 9900 Å aluminum metallization layer lift-off in acetone with ultrasonic agitation for 8 hours.

Aside from the differences listed immediately above, and aside from the inventive post-soak bake and post-metallization bake, the metallization pattern of this comparative example was formed using the same equipment and same parameters as in the inventive example.

FIG. 14a shows the resist profile of the patterned resist layer formed by the prior art process, and FIG. 14b includes magnified end portions of the resist profile shown in FIG. 14a. The resist profile has an overhang length of only about 0.1 µm. Accordingly, comparing FIGS. 10a and 10b to FIGS. 14a and 14b, respectively, it can be seen that the resist profile formed in accordance with the process of the present invention has negative slope in the sidewalls thereof and improved overhang length, when compared to the resist profile formed in accordance with the prior art process.

FIGS. 15a and 15b show the resist profile and deposited metal layer formed in accordance with the prior art process of this comparative example. FIG. 15b shows the opposite sides of the structure of FIG. 15a at an increased magnification. FIGS. 15a and 15b clearly show that metallization of the resist side metallization of metallization of the resist sidewalls inhibits access of the acetone to the resist layer and also acts as an anchor between the metallized layer on top of the resist layer and the metallized layer on the substrate surface. Accordingly, it took nearly 8 hours to lift-off the resist layer formed in accordance with the prior art process of this comparative example.

Figure 16A:
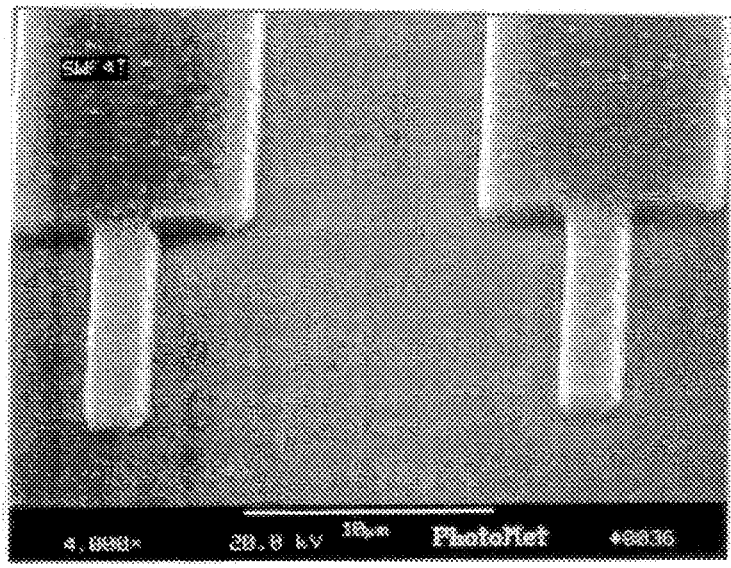
FIGS. 16a and 16b show the line quality of the metallization pattern formed by the process of FIG. 6.
Figure 16B:
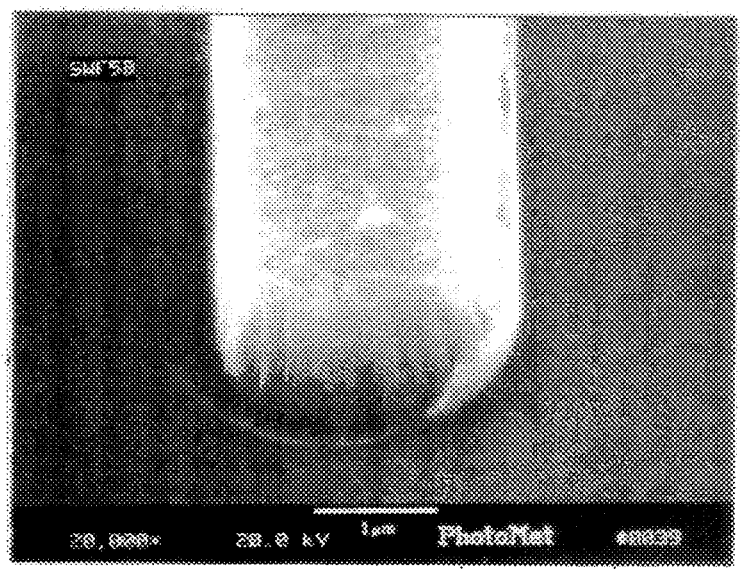
Figure 17:
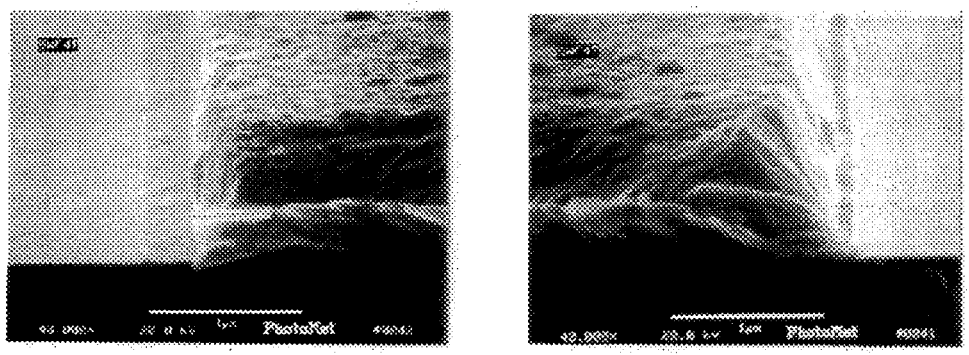
FIG. 17 also shows the line quality of the metallized pattern formed by the process of FIG. 6.

FIGS. 16a and 16b show the line quality of the metallized pattern formed in accordance with the prior art process of this comparative example. FIG. 16b is a magnified portion of FIG. 16a. FIG. 17 also shows the line quality of the metallization pattern formed according to the prior art process.

A comparison between FIGS. 12a, 12b and 13, and FIGS. 16a, 16b and 17, respectively, shows that the line quality of the metallized pattern is improved when formed in accordance with the process of the present invention.

Although the present invention has been described in detail hereinabove, it will be understood by those of ordinary skill in the art that certain modifications and changes could be made to the invention without departing from the spirit and scope thereof as defined in the appended claims.

What is claimed is:

1. A process for forming a pattern of material on a substrate, comprising the steps of:

depositing a single photoresist layer on an upper surface of said substrate to form a resist/substrate preform;

subjecting said resist/substrate preform to a first heat treatment to adhere said resist layer to said substrate;

immersing said resist/substrate preform in a bath of aromatic solvent;

subjecting said resist/substrate preform to a second heat treatment;

exposing portions of said resist layer in the shape of said pattern;

developing said resist layer to remove said exposed portions thereof and form a patterned resist layer wherein openings are provided through said resist layer to expose the upper surface of said substrate;

applying a layer of deposition material on the patterned resist layer and through the openings therein to forms aid pattern of said deposition material on the upper surface of said substrate;

subjecting said substrate, with the remaining resist layer and deposition material thereon, to a third heat treatment at a temperature within a range of about 100° C. to 140° C. and immersing said substrate, with the remaining resist layer and deposition material thereon, in a solvent bath to lift-off said resist layer, with deposition material thereon, while leaving said pattern of deposition material on the upper surface of said substrate.

2. The process of claim 1, wherein said resist layer comprises novolak resins.

3. The process of claim 1, wherein said first heat treatment is performed at a temperature ranging from 80°–100° C. for about 10–30 minutes.

4. The process of claim 1, wherein said first heat treatment is performed at about 90° C. for about 20 minutes.

5. The process of claim 1, wherein said aromatic solvent comprises chlorobenzene.

6. The process of claim 5, wherein said resist/substrate preform is immersed in chlorobenzene for 5–25 minutes.

7. The process of claim 5, wherein said resist/substrate preform is immersed in chlorobenzene for 10–20 minutes.

8. The process of claim 5, wherein said resist/substrate preform is immersed in chlorobenzene for about 15 minutes.

9. The process of claim 1, wherein said second heat treatment is performed at a temperature ranging from 80°–100° C. for about 5–15 minutes.

10. The process of claim 1, wherein said second heat treatment is performed at about 9020 C. for about 10 minutes.

11. The process of claim 1, wherein UV radiation is used to expose portions of said resist layer.

12. The process of claim 11, wherein said portions of said resist layer are exposed for about 5–15 seconds.

13. The process of claim 11, wherein said portions of said resist layer are exposed for about 7.5 seconds.

14. The process of claim 1, wherein said deposition material comprises metal.

15. The process of claim 14, wherein said metal is selected from the group consisting of Al, Au, Cr, Ni, Pt, Ta, Ti, mixtures thereof of and alloys thereof.

16. The process of claim 1, wherein said substrate comprises a transparent material.

17. The process of claim 16, wherein said substrate comprises at least one material selected from the group consisting of GaAs and LiNbO$_3$.

18. The process of claim 1, wherein said solvent bath comprises acetone.

19. The process of claim 18, wherein said solvent bath is subjected to ultrasonic agitation.

20. The process of claim 19, wherein said resist layer, with said deposition material formed thereon, is removed from said substrate in no more than 15 minutes.

21. The process of claim 1, wherein said third heat treatment is performed at a temperature ranging from 110°–130° C. for about 20–30 minutes.

22. The process of claim 1, wherein said third heat treatment is performed at about 120° C. for about 25 minutes.

23. The process of claim 1, wherein said second heat treatment is performed at a temperature greater than 80° C., but not greater than 100° C.

24. The process of claim 1, wherein said third heat treatment is performed for about 15 to 35 minutes.

* * * * *